US007485929B2

(12) United States Patent
Chen et al.

(10) Patent No.: US 7,485,929 B2
(45) Date of Patent: Feb. 3, 2009

(54) SEMICONDUCTOR-ON-INSULATOR (SOI) STRAINED ACTIVE AREAS

(75) Inventors: Hao-Yu Chen, Kaohsiung (TW); Fu-Liang Yang, Hsin-Chu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 11/522,282

(22) Filed: Sep. 15, 2006

(65) Prior Publication Data

US 2007/0010048 A1   Jan. 11, 2007

Related U.S. Application Data

(62) Division of application No. 11/089,403, filed on Mar. 23, 2005, now Pat. No. 7,125,759.

(51) Int. Cl.
*H01L 27/12* (2006.01)
(52) U.S. Cl. ............................. 257/351; 257/E21.321
(58) Field of Classification Search ........................ None
See application file for complete search history.

(56) References Cited

U.S. PATENT DOCUMENTS

2001/0003364 A1*  6/2001  Sugawara et al. .......... 257/192
2003/0085424 A1*  5/2003  Bryant et al. .............. 257/347
2003/0201497 A1*  10/2003  Inoue et al. ............... 257/351

\* cited by examiner

*Primary Examiner*—Evan Pert
*Assistant Examiner*—Ben P Sandvik
(74) *Attorney, Agent, or Firm*—Tung & Associates

(57) ABSTRACT

Differentially strained active regions for forming strained channel semiconductor devices and a method of forming the same, the method including providing a semiconductor substrate comprising a lower semiconductor region, an insulator region overlying the lower semiconductor region and an upper semiconductor region overlying the insulator region; forming a doped area of the insulator region underlying a subsequently formed NMOS active region; patterning the upper semiconductor region to form the NMOS active region and a PMOS active region; carrying out a thermal oxidation process to produce a differential-volume expansion in the PMOS active region with respect to the NMOS active region; forming recessed areas comprising the insulator region adjacent either side of the PMOS active region; and, removing layers overlying the upper semiconductor region to produce differentially strained regions comprising the PMOS and NMOS active regions.

23 Claims, 4 Drawing Sheets

SEMICONDUCTOR-ON-INSULATOR (SOI) STRAINED ACTIVE AREAS

CROSS REFERENCE TO RELATED APPLICATIONS

Application Ser. No. 11/522,282 is a division of application of Ser. No. 11/089,403 filed Mar. 23, 2005, now U.S. Pat. No. 7,125,759.

FIELD OF THE INVENTION

This invention generally relates to microelectronic integrated circuit (IC) semiconductor devices and fabrication processes and more particularly to semiconductor-on-insulator (SOI) substrates having strained regions for forming subsequent devices having improving charge carrier mobility formed according to an improved process flow and having improved reliability.

BACKGROUND OF THE INVENTION

With increasing demands for advanced semiconductor transistor structures, the use of dopants to control conduction of charge carriers in the conduction channel of CMOS devices is reaching its limits. As CMOS devices are scaled to the nanometer regime, SOI structures including fully depleted (FD) and partially depleted (PD) structures have provided an evolutionary pathway for MOSFETS operating at low power. However, SOI devices can exhibit the problem of self-induced heating, which can be exacerbated by reduced charge mobility in a transistor channel region.

Mechanical stresses are known to play a role in charge carrier mobility which affects several critical parameters including Voltage threshold ($V_T$) shift, drive current saturation ($I_{Dsat}$), and ON/Off current. The effect of induced mechanical stresses to strain a MOSFET device channel region, and the effect on charge carrier mobility is believed to be influenced by complex physical processes related to acoustic and optical phonon scattering. Ideally, an increase in charge carrier mobility will also increase a drive current.

For example, prior art processes have proposed lattice constant mismatch epitaxy to induce a stress on channel regions to form strained channel regions. Some of the shortcomings of this approach include the fact the level of induced strain can be relaxed in subsequent thermal heating processes, including self-induced heating effects, thereby reducing device performance. In addition, the manufacturing process typically requires complex and costly epitaxial growth process flows, typically requiring several epitaxial growth processes. Moreover, the lattice constant mismatch between materials, which is relied upon for producing a stress on the channel regions, can lead to junction leakage, reducing device reliability and performance.

There is therefore a need in the semiconductor device integrated circuit (IC) processing art to develop improved strained channel SOI devices and methods for forming the same to improve device performance as well as improving a process flow.

It is therefore an object of the invention to provide improved strained channel SOI devices and a method for forming the same to improve device performance as well as improving a process flow, while overcoming other shortcomings and deficiencies of the prior art.

SUMMARY OF THE INVENTION

To achieve the foregoing and other objects, and in accordance with the purposes of the present invention, as embodied and broadly described herein, the present invention provides differentially strained active regions for forming strained channel semiconductor devices and a method of forming the same.

In a first embodiment, the method includes differentially strained active regions for forming strained channel semiconductor devices and a method of forming the same, the method including providing a semiconductor substrate comprising a lower semiconductor region, an insulator region overlying the lower semiconductor region and an upper semiconductor region overlying the insulator region; forming a doped area of the insulator region underlying a subsequently formed NMOS active region; patterning the upper semiconductor region to form the NMOS active region and a PMOS active region; carrying out a thermal oxidation process to produce a differential volume expansion in the PMOS active region with respect to the NMOS active region; forming recessed areas comprising the insulator region adjacent either side of the PMOS active region; and, removing layers overlying the upper semiconductor region to produce differentially strained regions comprising the PMOS and NMOS active regions.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of forming SOI structures of the present invention is particularly advantageous in the formation of NMOS and PMOS devices in respective active areas on the same process wafer. For example, the method of the present invention may be applicable to formation of a pair of adjacent NMOS and PMOS devices (transistors) for simultaneous improvement of charge carrier mobility in both NMOS and PMOS devices.

Figure 1A:
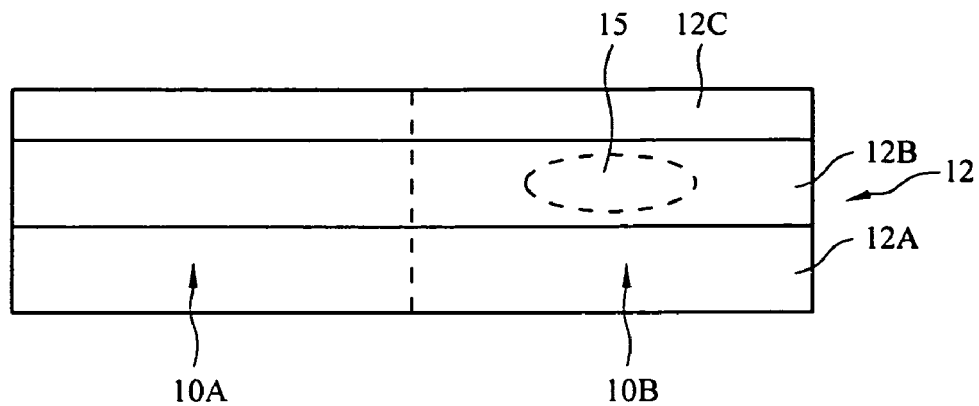
FIGS. 1A to 1G are cross sectional side views of an exemplary strained channel SOI device at stages in manufacture according to an embodiment of the present invention.

For example referring to FIG. 1A is shown a cross sectional view of an exemplary portion of a semiconductor-on-insulator (SOI) substrate. A semiconductor substrate 12, for example silicon, is provided with an electrical insulator region 12B, preferably a buried oxide (BOX) region, formed underlying the surface of the semiconductor substrate, forming lower semiconductor substrate portion 12A, and upper semiconductor substrate portion 12C. The buried oxide (BOX) layer (region) 12B, may be formed by conventional methods, for example where the level of the implant energy determines the depth and thickness of the BOX region. For example, a high energy (e.g., 200-1000 keV) implant of oxygen ions into the semiconductor substrate 12 followed by a high temperature anneal at about 1200° C. to about 1350° C.

It will also be appreciated that other conventional methods may be used to form the insulator region 12B. For example, the insulator region 12B is produced having a thickness of between about 100 Angstroms and about 5000 Angstroms. The upper semiconductor substrate portion 12C may have a thickness of from about 50 Angstroms to about 2000 Angstroms. It will be appreciated that the desired thickness of the insulator region 12B and the upper semiconductor substrate portion 12C may vary depending on the desired device (transistor) size, and desired operating constraints of the device.

Still referring to FIG. 1A, it will be appreciated that the semiconductor substrate 12 is doped according to ion implantation to form P-doped regions (P-well) and N-doped regions (N-well) for respectively forming NMOS devices (transistors) and PMOS devices (transistors) over the doped regions. In an important aspect of the invention, an ion implant process is carried out to implant one or more dopants, preferably one or more inert dopants, such as one or more of nitrogen, hydrogen, and helium, more preferably a hydrogen/helium co-implant, forming an implanted area e.g., 15, in the insulator region 12B, corresponding to a P-well portion e.g., 10B of the semiconductor substrate 12 while leaving the N-well portion 10A free of the inert ions.

Figure 1B:
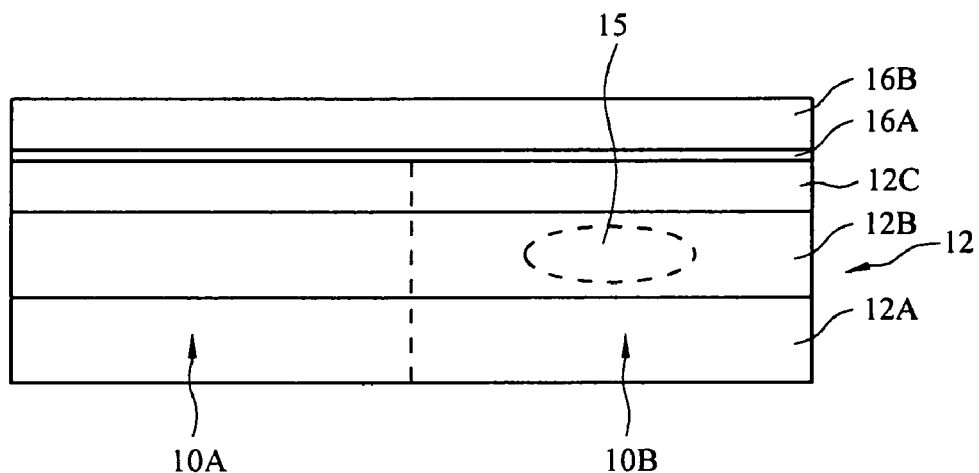

Referring to FIG. 1B, a hardmask layer 16B is formed over the semiconductor substrate 12, for example including first forming a silicon oxide (pad) layer 16A on the upper portion 12C of the semiconductor substrate by a conventional thermal growth or chemical vapor deposition (CVD) process, followed by formation of hardmask layer 16B by a CVD or PECVD process, for example a nitride and/or oxide such as one or more of SiN, SiON, and $SiO_2$.

Figure 1C:
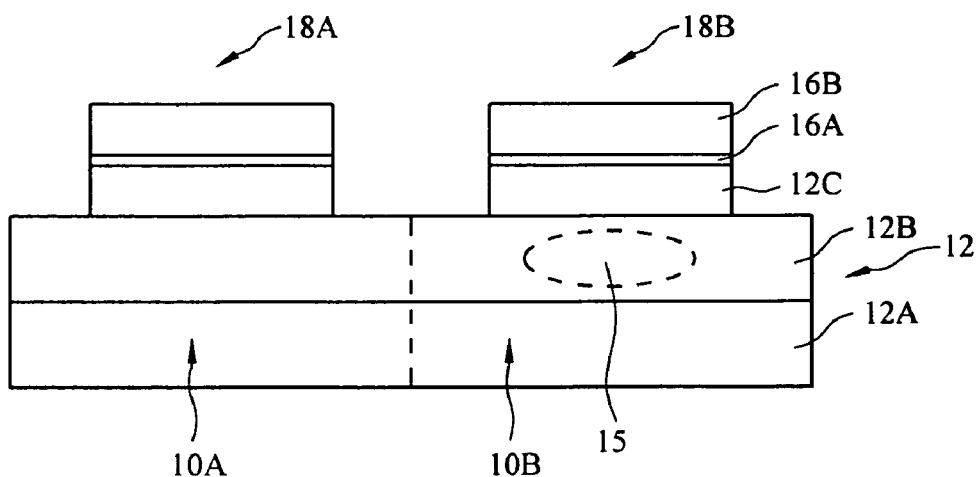

Referring to FIG. 1C, a conventional lithographic patterning process followed by an etching process is then carried out to etch through a thickness of the upper semiconductor substrate portion 12C to pattern active regions, e.g., PMOS active region 18A and NMOS active region 18B, protruding above the insulator (BOX) region 12B.

Figure 1D:
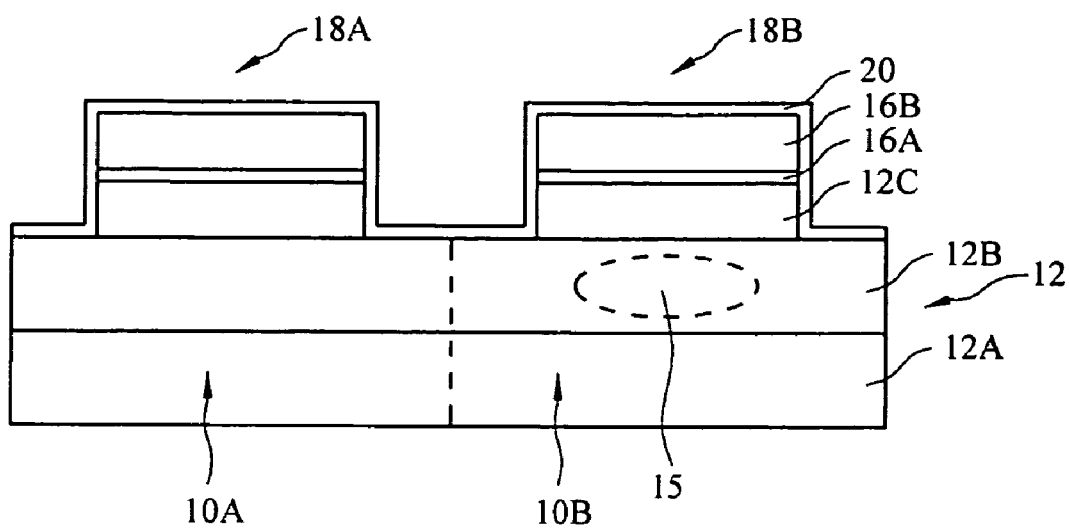

Referring to FIG. 1D, a silicon oxide liner layer 20 is then blanket deposited over the active regions 18A and 18B, preferably by a low temperature wet or dry, preferably a dry oxide formation process at a temperature less than about 900° C. For example, one exemplary low temperature oxidation process includes a first step carried out first at 200° C. to 300° C. to form a protective oxide followed by a second step carried out at higher temperatures from about 750° C. to about 900° C.

Figure 1E:
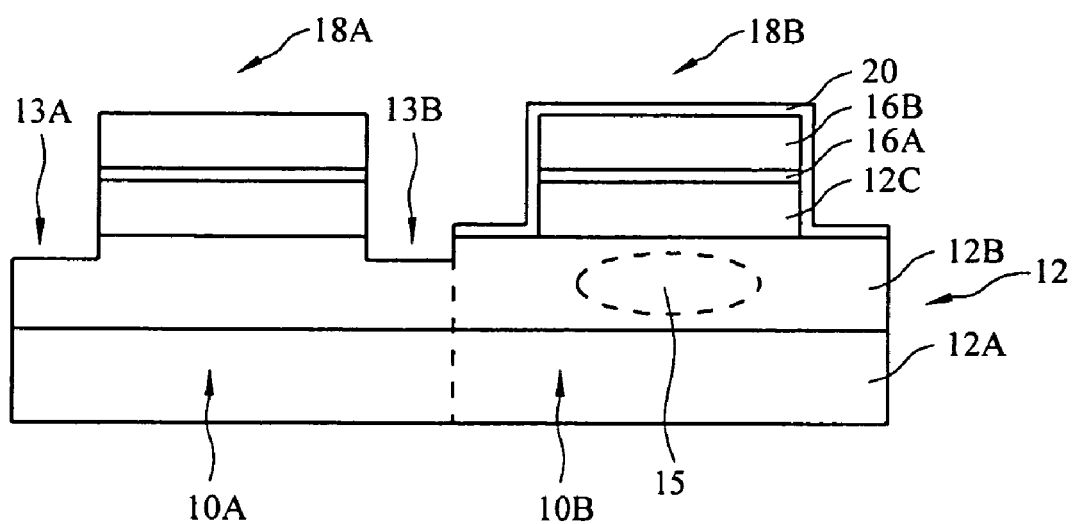

Referring to FIG. 1E, following the low temperature oxide layer 20 formation process, a conventional etching process, e.g., dry etching, is carried out to remove the oxide layer 20 portion overlying the PMOS active region 18A and remove a thickness portion of the BOX region 12B to form recessed areas e.g., 13A, 13B, adjacent either side of the PMOS active region. The NMOS active region 18B may be protected during the etching process by forming a protective layer (e.g., resist) over the NMOS active region 18B, prior to etching.

In an important aspect of the invention, during the oxide layer 20 formation process (thermal oxidation process), a compressive strain is preferentially created in the PMOS active region 18A due to a relatively larger volume expansion (differential volume expansion) of the BOX region portion 12B underlying PMOS active region 18A compared to the BOX region 12B underlying the NMOS active region 18B. For example, oxygen penetration into the semiconductor substrate portion 12C (e.g., Si) and the BOX region 12B region creates an oxide induced volume expansion (e.g., Si oxidation) inducing downward bending of the semiconductor substrate portion 12C in the PMOS active region 18A (e.g., concave downward at the semiconductor 12C/BOX region 12B interface). Conversely, the higher thermal expansion coefficient of the BOX region 12B in the NMOS active region 18B (due to inert ion doped area 15), causes upward bending of the semiconductor substrate portion 12C (e.g., concave upward at the semiconductor 12C/BOX region 12B interface).

Following the etching process to remove the oxide layer 20 overlying the PMOS active region 18A and forming recessed areas adjacent either side of the PMOS active region 18A, the preferential stresses formed include a compressive stress (strain) in the PMOS active region 18A and a tensile stress (strain) in the NMOS active region 18B. For example a depth of the recessed areas 13A, 13B may range from about 50 Angstroms to about 1000 Angstroms, more preferably from about 50 Angstroms to about 500 Angstroms.

Figure 1F:
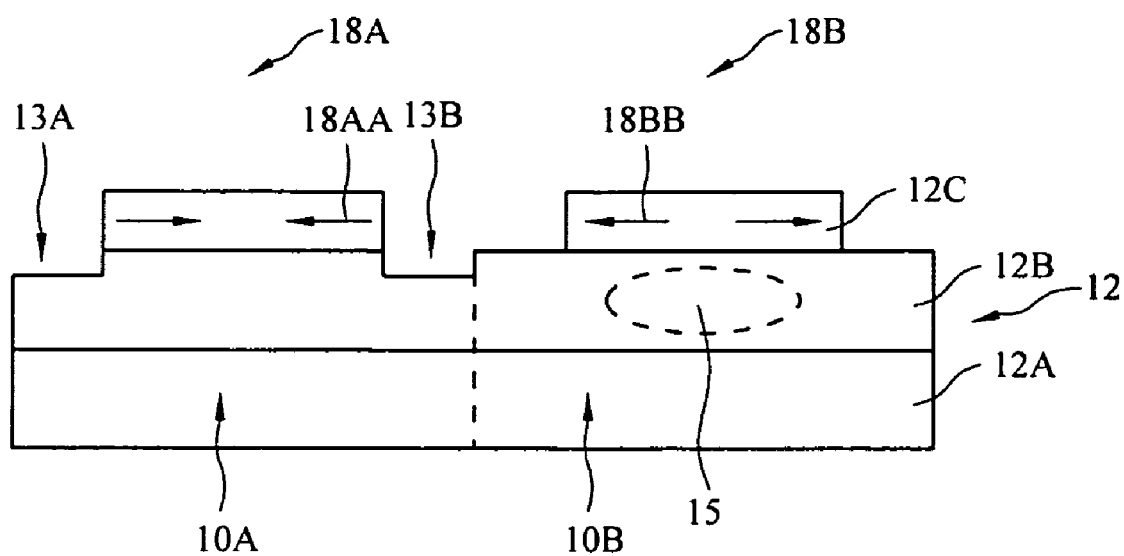

Referring to FIG. 1F, the remaining oxide layer portion 20 over NMOS active region 18B is removed and the hardmask 16B and oxide layer 16A portions are removed by conventional wet or dry etching processes, preferably wet etching The relatively compressive and tensile stresses (strains) in the BOX region 12B exert a selected level of laterally directed compressive stress, e.g., arrows 18AA, in the PMOS active region 18A, and a laterally directed tensile stress, e.g., arrows 18BB, in the NMOS active region 18B. It will be appreciated that the level of the induced stress caused by the differential volume expansion of the BOX region 12B may be controlled by a variety of factors including the thickness of the upper portion of the semiconductor (e.g., Si) substrate area 12C, the level of inert dopants in the BOX region 12B underlying the NMOS device region 18B, the temperature of the oxide liner layer formation process, and the depth of the recessed regions formed adjacent either side of the PMOS device region 18A. Thus, any or all of the above processes may be selectively controlled to achieve a desired compressive strained channel region for a PMOS device and a tensile strained channel region for a NMOS device. In addition, an additional optional thermal annealing process following removal of the oxide liner over the PMOS active region 18A or following removal of layers overlying both the PMOS and NMOS active regions may be carried out, e.g., in an inert atmosphere, to further adjust the level of relative stresses.

Figure 1G:
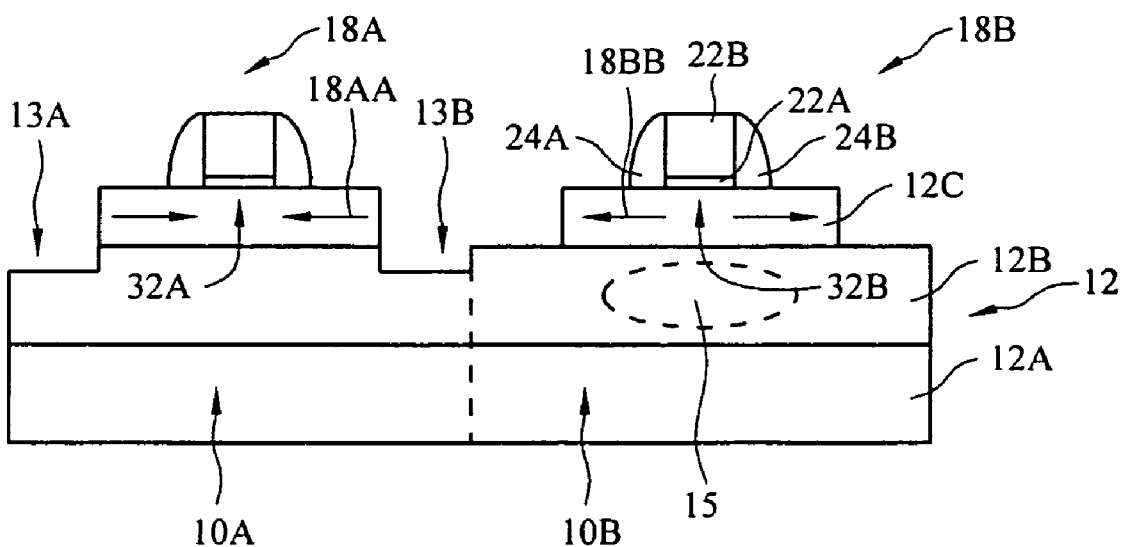

Referring to FIG. 1G, conventional processes may then be carried out to form NMOS and PMOS devices (e.g., transistors) including gate structures on the respective NMOS active region 18B and PMOS active region 18A. For example, conventional processes and materials are used to form gate dielectric portions, e.g., 22A, conductive gate electrode portions e.g., 22B, sidewall insulator spacers, e.g., 24A and 24B, and doped source/drain regions (not shown) in the upper semiconductor region 12C. As a result PMOS devices having a compressive strained channel region e.g., 32A and a NMOS device having a tensile strained channel region e.g., 32B may be formed to improve charge carried mobility in both NMOS and PMOS devices.

Figure 2:
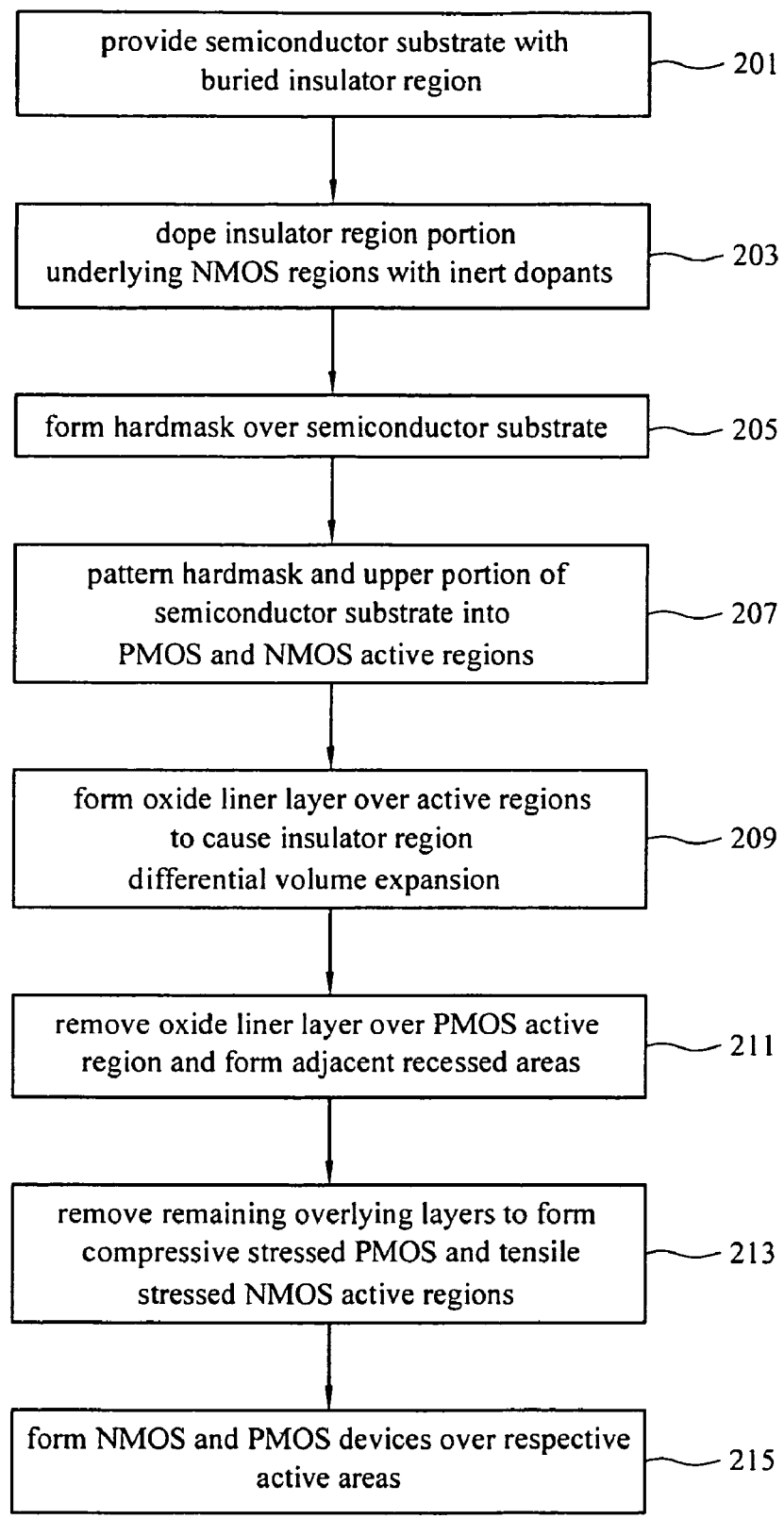
FIG. 2 is a process flow diagram including several embodiments of the present invention.

Referring to FIG. 2 is shown a process flow diagram including several embodiments of the present invention. In process 201, a semiconductor substrate is provided with a buried insulator region. In process 203, the insulator region portion of a subsequently formed NMOS active region is doped. In process 205, a hardmask layer is formed on the semiconductor substrate. In process 207, PMOS and NMOS active regions are patterned into the upper portion of the semiconductor substrate. In process 209, an oxide liner layer is formed over the active regions causing a differential volume expansion of the NMOS and PMOS insulator region portions. In process 211, the oxide liner layer is removed over the PMOS active region including forming recessed areas adjacent either side of the PMOS active region. In process 213, remaining layers including the hardmask layer and oxide layer are removed to expose the semiconductor substrate to form tensile stressed NMOS active regions and compressive stressed PMOS active regions. In process 215, subsequent conventional processes are carried out to form NMOS and PMOS devices over respective active areas.

Thus, a method has been presented for forming NMOS and PMOS device active regions formed in respective tensile stress and compressive stress thereby forming respectively strained active regions for improving charge carrier mobility in transistor devices having a respectively strained channel subsequently formed on the respective strained active regions. Advantageously, the method of the present invention has been found to improve charge carrier mobility, and therefore device performance, without the shortcomings of degradation due to self-heating effects and without the complex process of epitaxial growth steps to produce strained channel regions. The simplified process flow of the present invention increases wafer throughput and yield in a strained channel transistor formation process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. Strained active areas with differential strain for forming strained channel semiconductor devices comprising:
   a semiconductor substrate comprising a lower semiconductor region, an insulator region overlying the lower semiconductor region and upper semiconductor region portions overlying the insulator region;
   differentially strained NMOS and PMOS active regions comprising respective portions of the upper semiconductor region;
   an inert dopant region comprising the insulator region disposed underlying the NMOS active region, said inert dopant region comprising inert dopants selected from the group consisting of nitrogen, hydrogen, and helium;
   wherein recessed areas comprising the insulator region are disposed adjacently either side of the PMOS active region.

2. The strained active areas of claim 1, wherein the strained PMOS active region comprises a compressive strain.

3. The strained active areas of claim 1, wherein the strained NMOS active region comprises a tensile strain.

4. The strained active areas of claim 1, wherein the inert dopant region consists essentially of atomic hydrogen and helium ions.

5. The strained active areas of claim 1, wherein the lower and upper semiconductor regions comprise silicon.

6. The strained active areas of claim 1, wherein the insulator region comprises a buried oxide (BOX) region.

7. The strained active areas of claim 1, wherein the recessed areas have a depth of from about 50 Angstroms to about 500 Angstroms.

8. The strained active areas of claim 1, wherein the recessed areas extend into the insulator region.

9. The strained active areas of claim 1, wherein the strained channel semiconductor devices comprises MOSFET devices.

10. The strained active areas of claim 1, wherein the inert dopant region has a higher coefficient of thermal expansion than an undoped insulator region underlying the PMOS active region.

11. Strained PMOS and NMOS active areas for forming strained channel semiconductor devices comprising:
    a semiconductor substrate comprising a lower semiconductor region, an insulator region overlying the lower semiconductor region and upper semiconductor region portions overlying the insulator region;
    a tensile strained NMOS active region and a compressive strained PMOS active region comprising respective, portions of the upper semiconductor region;
    an inert dopant region comprising a dopant selected from the group consisting of nitrogen, hydrogen, and helium within the insulator region disposed underlying the NMOS active region; and,
    recessed areas extending into the insulator region adjacently disposed either side of the PMOS active region.

12. The strained active areas of claim 11, wherein the inert dopant region consists essentially of atomic hydrogen and helium ions.

13. The strained active areas of claim 12, wherein the lower and upper semiconductor regions comprise silicon.

14. The strained active areas of claim 12, wherein the insulator region comprises a buried oxide (BOX) region.

15. The strained active areas of claim 12, wherein the recessed areas have a depth of from about 50 Angstroms to about 500 Angstroms.

16. The strained active areas of claim 12, wherein the strained channel semiconductor devices comprises MOSFET devices.

17. The strained active areas of claim 12, wherein the inert dopant region has a higher coefficient of thermal expansion than an undoped insulator region underlying the PMOS active region.

18. Strained active areas with differential strain for forming strained channel MOSFET semiconductor devices comprising:
    a semiconductor substrate comprising a lower semiconductor region, an insulator region overlying the lower semiconductor region and upper semiconductor region portions overlying the insulator region;
    differentially strained NMOS and FMOS active regions comprising respective :portions of the upper semiconductor region;
    an inert dopant region comprising inert dopants within the insulator region disposed underlying the NMOS active region, said inert dopant region having a higher coefficient of thermal expansion than an undoped insulator region underlying the PMOS active region;
    wherein recessed areas extending into the insulator region are disposed adjacently either side of the PMOS active region.

19. The strained active areas of claim 18, wherein the inert dopant region comprises a dopant selected from the group consisting of nitrogen, hydrogen, and helium.

20. The strained active areas of claim 18, wherein the inert dopant region consists essentially of atomic hydrogen and helium ions.

21. The strained active areas of claim 18, wherein the lower and upper semiconductor regions comprise silicon.

22. The strained active areas of claim 18, wherein the insulator region comprises a buried oxide (BOX) region.

23. The strained active areas of claim 18, wherein the recessed areas have a depth of from about 50 Angstroms to about 500 Angstroms.

* * * * *